(12) United States Patent
Park et al.

(10) Patent No.: US 11,535,929 B2
(45) Date of Patent: Dec. 27, 2022

(54) APPARATUS FOR DEPOSITING A SUBSTRATE AND DEPOSITION SYSTEM HAVING THE SAME

(71) Applicant: SAMSUNG ELECTRONICS CO., LTD., Suwon-si (KR)

(72) Inventors: Jeong-Heon Park, Hwaseong-si (KR); Whankyun Kim, Seoul (KR); Sukhoon Kim, Hwaseong-si (KR); Junho Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 128 days.

(21) Appl. No.: 16/898,609

(22) Filed: Jun. 11, 2020

(65) Prior Publication Data
US 2021/0102285 A1 Apr. 8, 2021

(30) Foreign Application Priority Data
Oct. 2, 2019 (KR) .......................... 10-2019-0122511

(51) Int. Cl.
*C23C 14/46* (2006.01)
*H01L 21/687* (2006.01)
*H01L 21/67* (2006.01)
*H01L 21/677* (2006.01)

(52) U.S. Cl.
CPC ........ *C23C 14/46* (2013.01); *H01L 21/68764* (2013.01); *H01L 21/6773* (2013.01); *H01L 21/67167* (2013.01)

(58) Field of Classification Search
None
See application file for complete search history.

(56) References Cited

U.S. PATENT DOCUMENTS

| 4,793,908 A * | 12/1988 | Scott ..................... C23C 14/221 204/192.11 |
| 7,919,142 B2 | 4/2011 | Yeom et al. |
| 10,109,498 B2 | 10/2018 | Hautala |
| 2004/0175944 A1 * | 9/2004 | Kobayashi ........ H01J 37/32082 438/689 |
| 2005/0173403 A1 * | 8/2005 | Benjamin ............... H01J 37/20 219/444.1 |
| 2010/0264022 A1 | 10/2010 | Chim et al. |
| 2011/0162581 A1 | 7/2011 | Yeom et al. |
| 2013/0122252 A1 * | 5/2013 | Ode ........................ C23C 14/46 428/141 |

(Continued)

FOREIGN PATENT DOCUMENTS

| KR | 10-0669828 B1 | 1/2007 |
| KR | 10-0834114 B1 | 6/2008 |
| KR | 10-0838045 B1 | 6/2008 |

(Continued)

*Primary Examiner* — Jason Berman
(74) *Attorney, Agent, or Firm* — Lee IP Law, P.C.

(57) ABSTRACT

An ion beam deposition apparatus includes a substrate assembly to secure a substrate, a target assembly slanted with respect to the substrate assembly, the target assembly including a target with deposition materials, an ion gun to inject ion beams onto the target, such that ions of the deposition materials are discharged toward the substrate assembly to form a thin layer on the substrate, and a substrate heater to heat the substrate to a deposition temperature higher than a room temperature.

16 Claims, 6 Drawing Sheets

(56) References Cited

U.S. PATENT DOCUMENTS

2019/0035676 A1  1/2019  Yang et al.
2019/0157037 A1  5/2019  Tomimatsu et al.

FOREIGN PATENT DOCUMENTS

KR  10-2014-0097315 A  8/2014
KR  10-2019-0029755 A  3/2019
KR  10-2019-0056966 A  5/2019

* cited by examiner

APPARATUS FOR DEPOSITING A SUBSTRATE AND DEPOSITION SYSTEM HAVING THE SAME

CROSS-REFERENCE TO RELATED APPLICATION

Korean Patent Application No. 10-2019-0122511, filed on Oct. 2, 2019, in the Korean Intellectual Property Office, and entitled: "Ion Beam Deposition Apparatus and a Deposition System Having the Same," is incorporated by reference herein in its entirety.

BACKGROUND

1. Field

Example embodiments relate to an ion beam apparatus and a deposition system having the same, and more particularly, to an ion beam deposition apparatus for forming a low resistive thin layer on a substrate by using ion beams and a deposition system having the same.

2. Description of the Related Art

Metal wirings for semiconductor devices may be formed by a chemical vapor deposition (CVD) process or a physical vapor deposition (PVD) process. However, the metal wirings formed by the CVD process or the PVD process may exhibit relatively high resistance.

SUMMARY

According to exemplary embodiments, there is provided an ion beam deposition (IBD) apparatus, including a substrate assembly to secure a substrate, a target assembly slanted with respect to the substrate assembly, the target assembly including a target with deposition materials, an ion gun to inject ion beams onto the target, such that ions of the deposition materials are discharged toward the substrate assembly to form a thin layer on the substrate, and a substrate heater to heat the substrate to a deposition temperature higher than a room temperature.

According to exemplary embodiments, there is provided another IBD apparatus, including a process chamber to accommodate an ion beam deposition process, a substrate assembly inside the process chamber, the substrate assembly to secure a substrate, a target assembly slanted with respect to the substrate assembly, the target assembly including a target with deposition materials, an ion gun inside the process chamber, the ion gun to inject ion beams onto the target, such that ions of the deposition materials are discharged toward the substrate assembly to form a thin layer on the substrate, a substrate heater inside the process chamber, the substrate heater to heat the substrate to a deposition temperature higher than a room temperature, a substrate terminal connected to the process chamber, the substrate terminal to accommodate a plurality of substrates, and a vacuum generator connected to the process chamber, the vacuum generator to apply a uniform predetermined vacuum pressure to the process chamber.

According to exemplary embodiments, there is provided an IBD system including a substrate loader including a substrate handler, a substrate supplier positioned at a side of the substrate loader and including a substrate terminal in which a plurality of substrates may be stacked, and at least an ion beam deposition apparatus positioned at another side of the substrate loader and conducting an ion beam deposition process to the substrate that may be loaded from the substrate terminal by the substrate handler, to thereby form a thin layer on the substrate. In such a case, the ion beam deposition apparatus may include a process chamber in which the ion beam deposition process may be conducted, a substrate assembly secured to a side of the process chamber and onto which the substrate may be secured, a target assembly slanted with respect to the substrate assembly in the process chamber and to which a target may be secured such that the target may include deposition materials, an ion gun secured to another side of the process chamber and injecting ion beams onto the target such that ions of the deposition materials may be discharged from the target as deposition particles and may be deposited into the thin layer on the substrate, a substrate heater heating the substrate to increase the degree of crystallinity of the thin layer, and a vacuum generator connected to the process chamber and maintaining an inside of the process chamber under a vacuum pressure.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
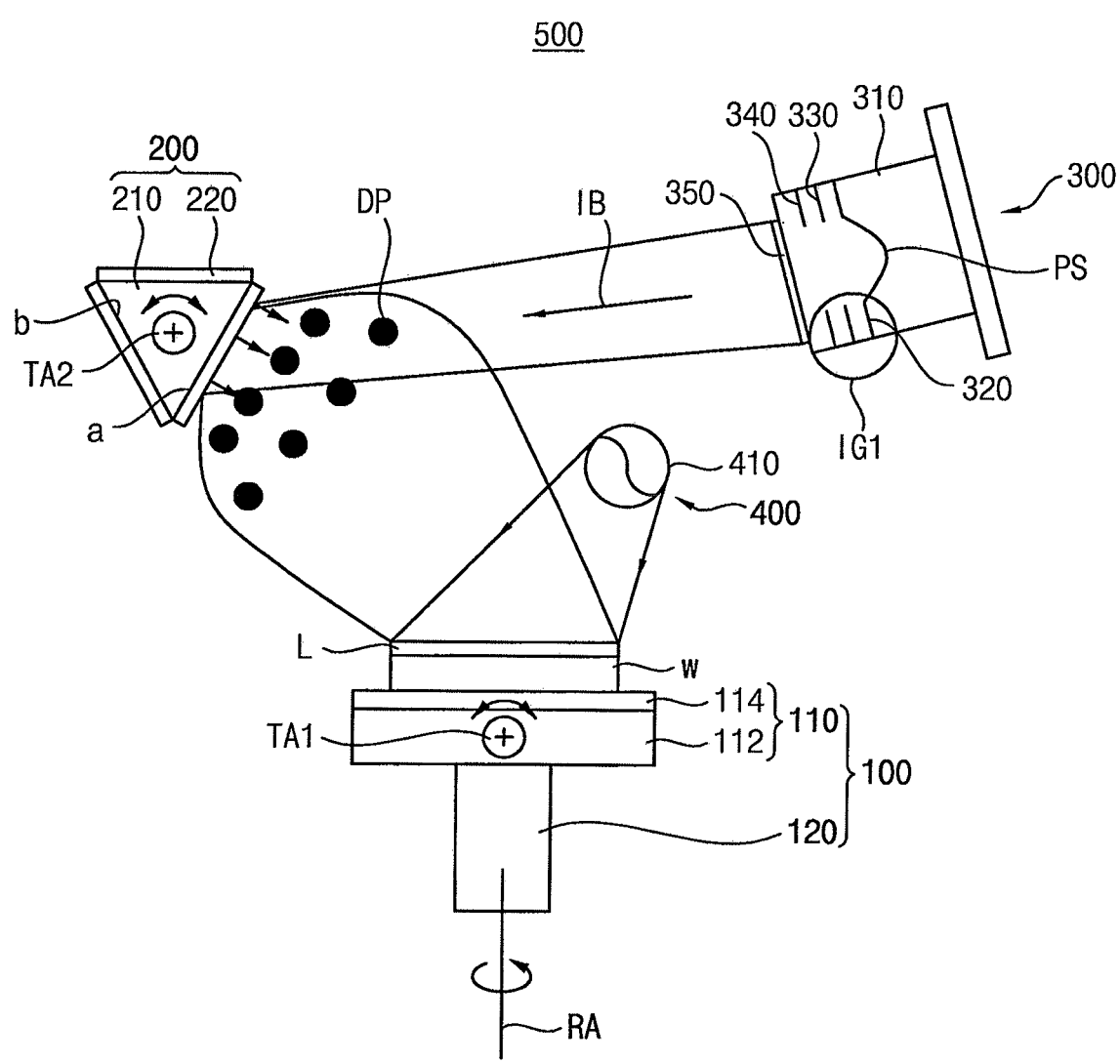
FIG. 1 illustrates a schematic view of an ion beam deposition apparatus in accordance with an example embodiment.

FIG. 1 is a schematic view of an ion beam deposition apparatus in accordance with an example embodiment.

Referring to FIG. 1, an ion beam deposition (IBD) apparatus 500 in accordance with an example embodiment may include a substrate assembly 100, onto which a substrate W may be secured, a target assembly 200 slanted with respect to the substrate assembly 100, and to which a target 220 with deposition materials may be secured, an ion gun 300 injecting ion beams IB onto the target 220, and a substrate heater 400 heating the substrate W. When the ion gun 300 injects ion beams IB onto the target 220, ions of the deposition materials may be discharged from the target 220 as deposition particles DP and may be deposited into a thin layer L on the substrate W. The substrate heater 400 heats the substrate W at a deposition temperature higher than a room temperature.

In an example embodiment, the substrate assembly 100 may include a substrate holder 110 holding the substrate W, and a support 120 supporting the substrate holder 110. The substrate holder 110 and the support 120 may be perpendicular to each other or the substrate holder 110 may tilt at a predetermined angle with respect to the support 120. The support 120 may rotate with respect to a rotation axis RA in such a configuration that the substrate holder 110 may be rotated according to the rotation of the support 120.

The substrate holder 110 may include a body 112 formed of conductive materials, e.g., aluminum (Al), and a chuck 114 secured to a top surface of the body 112 to chuck the substrate W. For example, the body 112 may be between the chuck 114 and the support 120.

The body 112 may have a size and a shape convenient for holding the chuck 114, e.g., the body 112 and chuck 114 may have a same shape and a same width. A guide electrode may be, e.g., selectively, provided in the body 112 for guiding the deposition particles DP to the substrate W. For example, a heating element, e.g., the substrate heater 400 described in detail below, may be provided with the substrate holder 110 to maintain the substrate W under a uniform deposition temperature during the IBD process.

The body 112 may be tilted or rotated with respect to a tilting axis TA1, e.g., the tilting axis TA may be substantially horizontal with respect to a top surface of the body 112 and substantially perpendicular to the rotation axis RA (e.g., the tilting axis TA extends into the page in FIG. 1). Thus, the body 112 may be tilted or slanted at a predetermined slant angle. That is, the body 112 may be tilted clockwise and/or counterclockwise at the slant angle with reference to a horizontal top surface of the support 120.

The substrate W may be secured to the chuck 114, and the chuck 114 may be rotated or tilted in accordance with the rotation or tilting of the body 112. Thus, the substrate W may also be rotated or tilted in accordance with the rotation or tilting of the body 112. The slant angle of the body 112 may be determined in such a way that the deposition particles DP may be deposited onto the substrate W with an optimal efficiency, e.g., the slant angle of the body 112 may be adjusted with respect to overlap between the body 112 and the target 220 to increase desired thickness or coverage of the layer L on the substrate W.

Thus, the slant angle of the body 112 may be varied according to a deposition angle of the deposition particles DP with respect to the substrate W. While the present example embodiment discloses that the substrate W is arranged horizontally, i.e., substantially perpendicularly to the support 120, to have a slant angle of substantially 0°, may be varied.

The chuck 114 may be shaped into, e.g., a disc, and may include insulation materials, e.g., ceramics. Various securing units may be provided with the chuck 114, and the substrate W may be secured to the substrate holder 110 by the chuck 114. For example, the chuck 114 may include an electrostatic chuck (ESC) including a pair of polyimide films and a conductive film interposed between the pair of polyimide films and connected to an electric power. In another example, the chuck 114 may include a mechanical securing unit, e.g., a plurality of clamps arranged along an edge of the body 112 at same intervals.

The support 120 may extend from a side, i.e., an interior sidewall, of the process chamber and support the substrate holder 110, and may rotate with respect to the rotation axis RA. The substrate holder 110 may be rotated according to the rotation of the support 120.

For example, the support 120 may include a support bar extending from a side wall of the process chamber and may contact a central portion of the body 112 in the process chamber. For example, a terminal point of the support 120, e.g., a point of contact of the support 120 with the substrate holder 110, may be variable just by controlling the extension length from the side wall of the process chamber, thus a loading position of the substrate W may be controlled just by changing the extension length of the support 120. The substrate holder 110 may be positioned on the support 120 horizontally with no tilting at the loading position, and the substrate W may be loaded on the substrate holder 110.

In addition, since the support 120 may rotate with respect to the rotation axis RA in the IBD process, the substrate W may be rotated in the IBD process via the support 120. For example, the substrate W may be slanted at the slant angle just by tilting the body 112, and thus the thin layer L may be uniformly formed on the substrate W in the IBD process.

In an example embodiment, the target assembly 200 may include at least the target 220 that may be slanted with respect to the substrate holder 110, e.g., with respect to the substrate W, and may include deposition materials. For example, the target assembly 200 may include a target body 210 shaped, e.g., into a polygon, and rotating with respect to a target axis TA2, and the target 220 secured to a side of the target body 210 and including deposition materials.

In the present example embodiment, the target body 210 may be shaped into a polygonal pillar, e.g., a polygonal pillar extending into the page in FIG. 1 and having a triangular cross-section, and the target axis TA2 may penetrate through a center of the target body 210, e.g., into the page in FIG. 1. The polygonal target body 210 may include a single target face "a" and a plurality of standby faces "b". For example, as illustrated in FIG. 1, the target face "a" may be arranged to face the substrate holder 110, while the standby faces "b" may be arranged away from the target face "a". The deposition particles DP may be discharged from the target face "a" and may be directed toward the substrate holder 110, e.g., toward the substrate W. The standby faces "b" may be the rest of the faces of the polygonal target body 210 except the target face "a". The substrate W, the target face "a" of the target body 210, and the ion gun 300 may constitute a deposition geometry in the IBD process. The optimization between a uniform abrasion of the target 220 and a uniform deposition of the deposition materials on the substrate W may be realized by the deposition geometry in the IBD process.

The standby face "b" may be exchanged with the target face "a" by rotating the target body 210, e.g., when the target body 210 rotates around the target axis TA2. In the present example embodiment, the target body 210 may be shaped into a trigonal pillar having a pair of standby faces "b" and a single target face "a", and thus three targets 220 may be maximally secured to the target body 210, e.g., one target 220 on each face of the trigonal pillar. However, the number of the standby faces "b" may be varied according to the number of the required targets 220. For example, when the target body 210 is shaped into an octagonal pillar, eight targets 220 may be maximally secured to the target body 210, i.e., one target 220 on the target face and seven targets 220 on seven standby faces.

The target 220 may be secured to at least one of the faces of the target body 210, i.e., to at least one of the target face "a" and the standby faces "b". The target 220 may include deposition materials and may be shaped into a plate covering the target face "a" or the standby faces "b". When high energy ion beams IB are injected onto the target 220 from the ion gun 300, the ion beams IB may collide with the deposition materials of the target 220, thereby causing the ions of the deposition materials to be discharged from the target 220 as the deposition particles DP.

The target 220 may be selected according to the desired composition of the thin layer L on the substrate W. For example, when a plurality of targets 220 including a same deposition material are secured to all the faces of the target body 210, the thin layer L may be formed into a single layer having a uniform composition. In another example, when a plurality of the targets 220 including different materials are secured to the faces of the target body 210, the thin layer L may be formed into a multilayer having different compositions.

The target 220 may include an additional rotating unit rotating the target 220 horizontally with respect to the target face "a". In such a case, the target 220 may be uniformly abraded in the IBD process just by the target rotation.

In the present example embodiment, the target 220 may include a low resistive metal, and thus a low resistive metal layer may be formed on the substrate W by the IBD process. For example, the target 220 may be a plate formed of a low resistive metal, so the ion beams IB colliding with the low resistive metal of the target 220 cause ions of the low resistive metal to be discharged toward the substrate holder 110 as the deposition particles DP. Examples of the low resistive metal may include tungsten (W), ruthenium (Ru), tantalum (Ta), titanium (Ti), aluminum (Al), copper (Cu), molybdenum (Mo), cobalt (Co), osmium (Os), platinum (Pt), nickel (Ni), chromium (Cr), silver (Ag), germanium (Ge), magnesium (Mg), palladium (Pd), hafnium (Hf), zinc (Zn), vanadium (V) and zirconium (Zr). Those materials may be used alone or in combinations thereof. In addition, any alloys of the above metals and any nitrides of the above metals may also be used as the low resistive metal. As a result, the deposition particle DP may also include a metal atom or a metal ion.

In an example embodiment, the ion gun 300 may inject ion beams IB onto the target 220 for discharging the deposition particles DP toward the substrate W. Source gases for the ion beams IB may be supplied to the ion gun 300, and the ion gun 300 may accelerate the source gases until the source gases are changed into high energy ion beams IB directed toward the target assembly 200.

For example, the ion gun 300 may include a first discharge chamber 310 ionizing a source gas into source ions, a first ion grid IG1 connected to the first discharge chamber 310 and accelerating the source ions toward the target assembly 200 to change the source ions into ion beams IB that may be directed toward the target assembly 200 with high energy state, and a neutralizer 350 emitting electrons to the ion beams to prevent neutralization arc around the target assembly 200.

The source gas may be supplied into the first discharge chamber 310 and may be changed into the source ions by an electric discharge or a plasma process in the first discharge chamber 310. For example, the first discharge chamber 310 may include a discharge cathode and a supply terminal that may be separated from each other, and the source gas may be supplied into a space between the discharge cathode and the supply terminal. Then, when an intensive electric field is applied between the discharge cathode and the supply terminal, the source gas may be electrically discharged and may be changed into the source ions. Otherwise, the first discharge chamber 310 may include a radio frequency inductively coupled plasma (RFICP) generator. Thus, the source gas in the first discharge chamber 310 may be changed into high energy source ions by an electromagnetic force in the first discharge chamber 310.

For example, the source gas may include inert gases, e.g., argon (Ar), krypton (Kr), neon (Ne) and xenon (Xe). Thus, the kinetic energy of the ion beams IB may be optimized, and the contamination caused by the impurities may be minimized in the IBD process.

The first ion grid IG1 may be connected to the first discharge chamber 310 and may accelerate the source ions until the source ions reach a high energy state and are directed straight toward the target 220. Thus, the source ions may be changed into a high energy ion beams IB in the first ion grid IG1. For example, the first ion grid IG1 may include a screen grid 320 defining the first discharge chamber 310, an acceleration grid 330 and a deceleration grid 340. The deceleration grid 340 may be selectively provided with the first ion grid IG1.

The screen grid 320 may be in contact with a plasmas sheath PS of the first discharge chamber 310, and the source ions may be extracted from the plasma sheath and may be transferred to the acceleration grid 330 by the screen grid 320. The acceleration grid 330 may accelerate the extracted source ions toward the target 220 until the source ions reach a sufficiently high kinetic energy state and are oriented sufficiently straight toward the target 220. Therefore, the source ions may be changed into the ion beams IB that may be straightly directed toward the target 220 by the acceleration grid 330. The deceleration grid 340 may be selectively provided with the first ion grid IG1 and may control the speed of the ion beams IB.

Each of the screen grid 320, the acceleration grid 330, and the deceleration grid 340 may include a plurality of injection holes through which the source ions or the ion beams IB may penetrate from the first discharge chamber 310 to the target 220. Thus, the energy of the ion beams IB and the injection area of the target 220 may be controlled by the hole size and gap distances between the screen grid 320 and the acceleration grid 330, and between the acceleration grid 330 the deceleration grid 340. For example, when the target body 210 is covered by the target 220, and the injection area of the target 220 is controlled to be smaller than the target 220, potential damage to the target body 210 caused by the ion beams IB may be prevented or substantial minimized in the IBD process.

The neutralizer 350 may be positioned at an end portion of the first ion grid IG1, e.g., to face the target 220, and may be shaped into a cylinder enclosing an injection hole through which the ion beams IB are injected onto the target 220. The neutralizer 350 may supply electrons into a gap space between the target 220 and the ion gun 300. The electrons in the gap space may decrease the voltage potential between the ion beams IB and the target 220 to thereby prevent or minimize the neutralization arc around the target 220. Thus, the amount of the supplied electrons in the gap space may be varied according to the material properties of the target 220, as well as insulation characteristics and ground characteristics of the gap space.

When the high energy ion beams IB are injected onto the target 220, the deposition materials, e.g., the material of the target 220, collide with the high energy ion beams IB, thereby causing the ions of the deposition materials to be discharged from the target 220 as the deposition particles DP toward the substrate W. Thus, the deposition particles DP may be deposited on the substrate W as the thin layer L. That is, the thin layer L may be formed on the substrate by the IBD process.

The layer characteristics of the thin layer L may be modified by the substrate heater 400. The substrate W may be heated in the IBD process by the substrate heater 400, thereby substantially improving the crystallinity degree of the thin layer L. An increased crystallinity degree of the thin layer L lowers the electric resistance of the thin layer L.

In general, when a comparative IBD process is conducted at a room temperature, a resultant thin layer formed by a comparative IBD apparatus may have a relatively small grain size and a relatively low crystallinity degree. As a result, there are limits to reducing the resistance of such a resultant thin layer, and its resistance is not sufficiently low for metal wirings of semiconductor devices.

In contrast, according to embodiments, the IBD apparatus includes the substrate heater 400 to heat the substrate W, thereby forming on the substrate W the thin layer L with a sufficiently large grain size and a relatively high crystallinity degree. As a result, the resistance of the thin layer L on the substrate W may be sufficiently reduced, e.g., as compared to a thin layer formed at room temperature without heating. Thus, the thin layer L formed by the IBD apparatus 500, according to example embodiments, may be used for low resistive metal wirings of semiconductor devices.

For example, the substrate heater 400 may include a lamp structure 410 emitting heat toward the substrate holder 110, e.g., toward the substrate W. The lamp structure 410 may be outside of the substrate assembly 100.

Various structures may be used as the lamp structure 410 as long as the structures is positioned over the substrate W, and may transfer a radiation heat onto the entire surface of the substrate W. For example, as illustrated in FIG. 1, the height and position of the lamp structure 410 relative to the substrate W may be adjusted to maximize heat irradiation of the entire surface of the substrate W.

The lamp structure 410 may include a vacuum quartz tube and a thermal radiator in the vacuum quartz tube. Thus, when an electric current is applied to both end portions of the quartz tube, a visible light or an infrared light may be illuminated on the substrate W with some radiation heat. The lamp structure 410 may include, e.g., one of a thermal carbon radiator, a xenon lamp, and a halogen lamp according to the configurations of the thermal radiator.

In a modified example embodiment, a substrate heater may include an electric heater that may be arranged inside the substrate holder 110 and may generate Joule's heat. This will be described in more detail below with reference to FIGS. 2-3, which illustrate substrate heaters in accordance with example embodiments.

Figure 2:
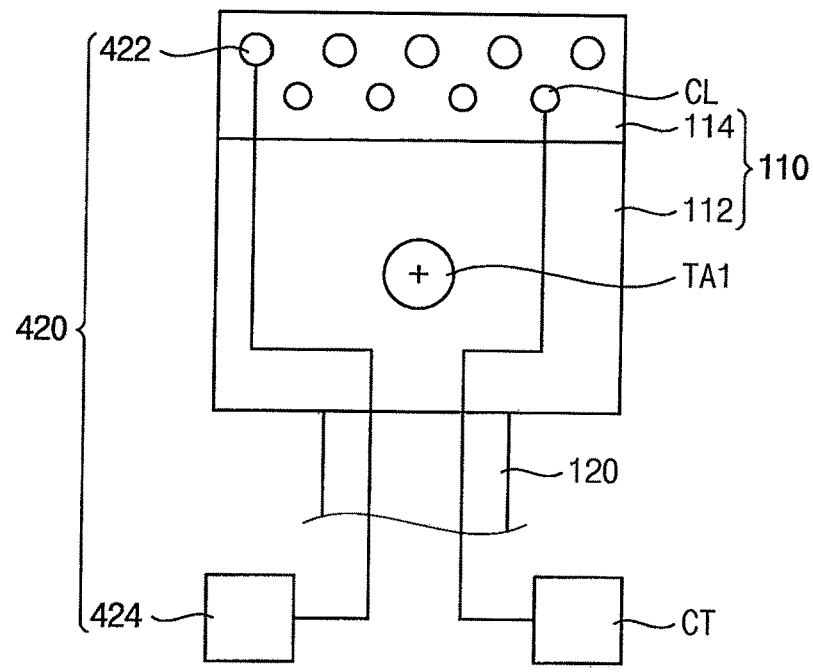
FIG. 2 illustrates a schematic view of a substrate heater in an ion beam deposition apparatus in accordance with an example embodiment.

Referring to FIG. 2, a substrate heater according to an example embodiment may be a line electric heater 420. The line electric heater 420 may include a line heat generator 422 arranged inside the chuck 114 and an electric power 424 applying power to the line heat generator 422 for generating Joule's heat.

In detail, the line heat generator 422 may be configured into a spiral line inside the chuck 114, e.g., inside a disk-shaped chuck 114. Thus, a plurality of curved electric lines may be arranged at the same intervals in a radial direction of the chuck 114, e.g., the line heat generator 422 may be a line heater (e.g., a wire) wrapped in a spiral shape inside the chuck 114 (FIG. 2 illustrates a cross section through the chuck 114 with spaced apart portions of the line heat generator 422). Both end portions of the line heat generator 422 may be connected to the electric power 424. Thus, the IBD process may be initiated, the Joule's heat may be generated from the line heat generator 422, and the chuck 114 may be uniformly heated. As a result, a substrate (positioned on the chuck 114) may also be uniformly heated along a whole surface, e.g., through its entire bottom surface contacting the chuck 114.

For example, a cooling line CL may be selectively provided in the chuck 114. A substrate may be under a uniform deposition temperature in the IBD process by the complementary effect of the cooling and heating in the chuck 114. The cooling line CL may also be configured into a spiral line in such a structure that the curved electric lines and the curved cooling lines may be alternately arranged in the radial direction of the chuck 114, e.g., a disk-shaped chuck.

For example, a coolant may be supplied into the cooling line CL from a coolant tank CT positioned at an exterior of the chuck 114, and the coolant may flow in the chuck 114 along the coolant line CL. Thus, the deposition temperature may be uniformly maintained just by controlling the temperature of the Joule's heat and the temperature of the coolant.

Figure 3:
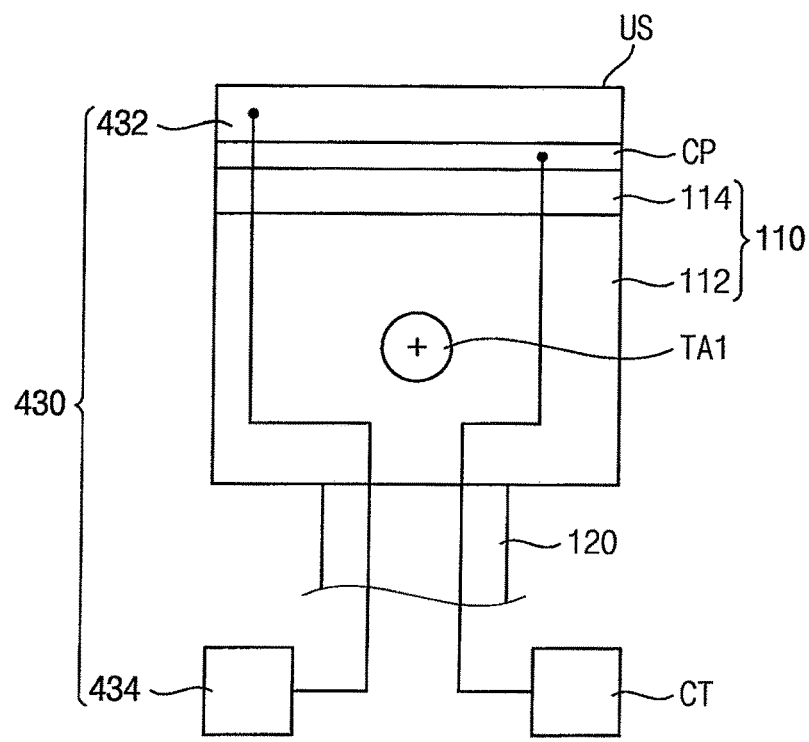
FIG. 3 illustrates a schematic view of a substrate heater in an ion beam deposition apparatus in accordance with an example embodiment.

FIG. 3 is a view illustrating a substrate heater in accordance with another example embodiment.

Referring to FIG. 3, the substrate heater may be a surface electric heater 430 having a surface heat generator 432 arranged in the chuck 114 and an electric power 424 applying power to the surface heat generator 432 for generating Joule's heat. The surface heat generator 432 may cover, e.g., define, an upper portion of the chuck 114.

In detail, as illustrated in FIG. 3, the surface heat generator 432 may fill the upper portion of the chuck 114 with a predetermined thickness, so the surface heat generator 432 may contact an inner side surface of the upper portion of the chuck 114 and an upper surface US of the chuck 114 may be covered by the surface heat generator 432 in the chuck 114. For example, the upper portion of the chuck 114 may be the surface heat generator 432, so an upper surface of the surface heat generator 432 may be the upper surface US of the chuck 114. Thus, a substrate may be positioned, e.g., directly, on the upper surface of the surface heat generator 432 (i.e., the upper surface US of the chuck 114).

The surface heat generator 432 may include a carbon plate uniformly generating the heat by the power applied from the electric power 424. Thus, the heat may be uniformly generated along an overall upper surface US of the chuck 114, and as a result, the substrate may be uniformly heated by the surface electric heater 430.

The temperature of the substrate W may be varied just by controlling the power that may be applied to the surface heat generator 432. However, a cooling plate CP may be further arranged under the surface heat generator 432 for reducing the time of the temperature control to the substrate and improving the temperature control accuracy.

The cooling plate CP may include a thermoelectric element having the same configuration as the surface heat generator 432. Thus, the cooling plate CP may contact the, e.g., entire, lower surface of the surface heat generator 432. When an electric power is applied to the thermoelectric element, the heat may flow to the thermoelectric element from the surface heat generator 432 by the Peltier effect. Thus, the temperature of the surface heat generator 432 may be controlled by the cooling plate CP.

While the present example embodiment discloses the thermoelectric element as the cooling plate CP, any other cooling units may also be used as the cooling plate CP as long as the heat of the surface heat generator 432 may sufficiently flow to the cooling unit.

For example, the substrate W may be under a deposition temperature in a range of about 150° C. to about 300° C. by the substrate heater in the IBD process. When the deposition temperature is below 150° C., the grain size and the crystallinity degree of the resultant deposited thin layer L may be substantially the same as those of a conventional IBD thin layer, and thus the resistance reduction may be negligible. When the deposition temperature is over 300° C., the grain size of the resultant thin layer may be much larger than that of a thin layer formed by sputtering, thereby decreasing the crystallinity degree of the thin layer L and increasing the specific resistance of the thin layer L.

For those reasons, the substrate heater according to example embodiments may heat the substrate W to a deposition temperature in a range of about 150° C. to about 300° C., e.g., about 200° C. to about 250° C.

Some comparative examples are disclosed in the following Table 1. A tungsten layer was formed on the substrate W at a high temperature according to example embodiments (i.e., high temperature IBD process), at a room temperature by an IBD process, and by a plasma sputtering process. The layer characteristics of each tungsten layer are listed in Table 1 below.

TABLE 1

|  | plasma sputtering process | room temperature IBD process | high temperature IBD process |
|---|---|---|---|
| deposition temperature | 350° C.~400° C. | 20° C.~30° C. | 200° C.~ 300° C. |
| grain size | 130 nm~200 nm | 30 nm~80 nm | 80 nm~100 nm |
| specific resistance | 8 Ωm~12 Ωm | 15 Ωm~20 Ωm | 5 Ωm~9 Ωm |

Table 1 shows that the high temperature IBD process provides a thin layer with a grain size that is smaller than that formed by the plasma sputtering process and larger than that formed at room temperature, while the specific resistance of the thin layer formed by the high temperature IBD is minimized. Thus, the IBD process conducted at a high deposition temperature in the IBD apparatus, according to example embodiments, may increase the crystallinity degree in the resultant thin layer and may decrease the specific resistance thereof by controlling the grain size in the thin layer.

Figure 4:
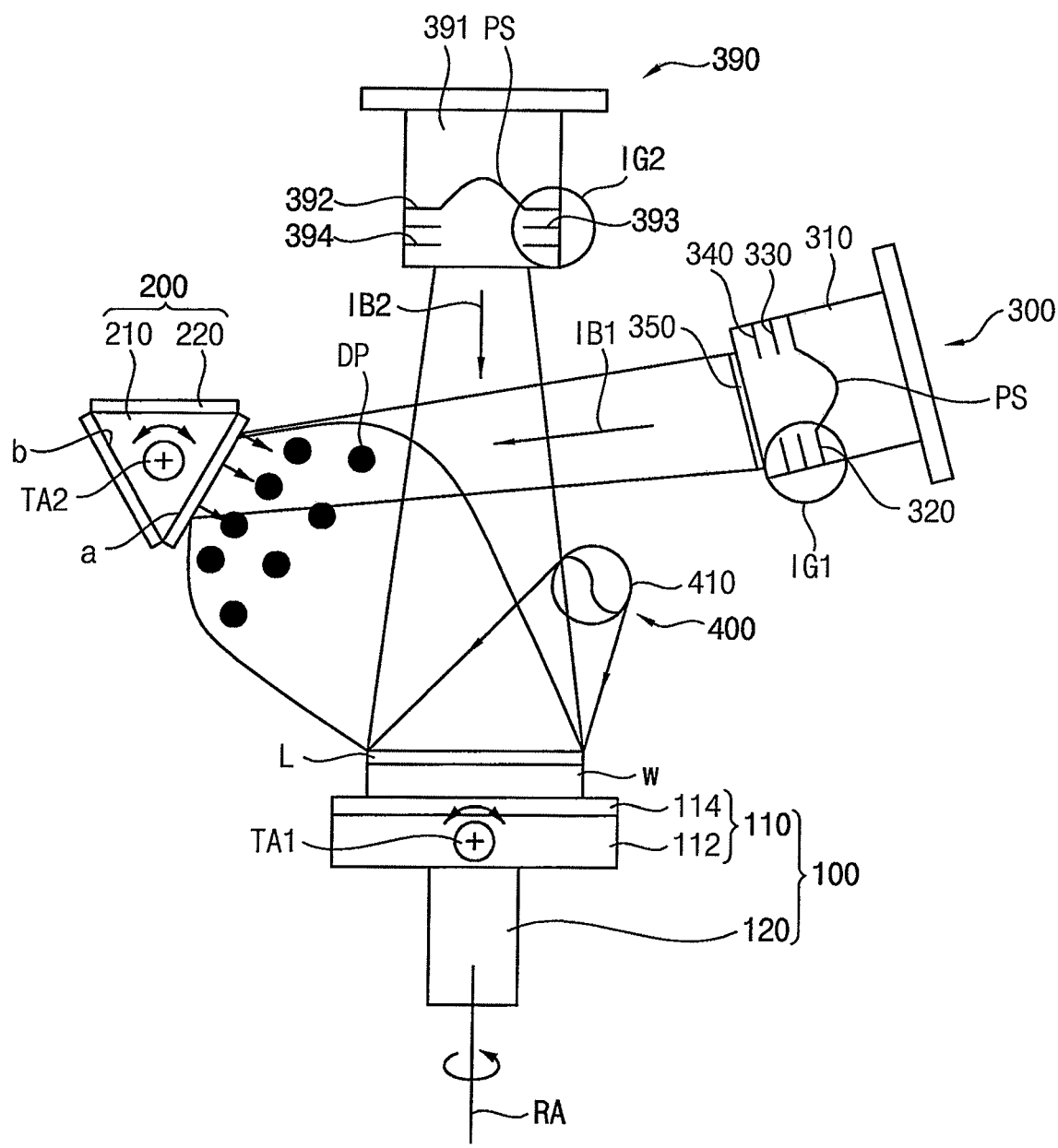
FIG. 4 illustrates a schematic view of an ion beam deposition apparatus in accordance with another example embodiment.

FIG. 4 is a structural view illustrating an ion beam deposition apparatus in accordance with another example embodiment.

A modified IBD apparatus 501 shown in FIG. 4 may have substantially the same structures as the IBD apparatus 500 shown in FIG. 1, except for a supplementary ion gun 390 for injection supplementary ion beams toward the substrate W. Thus, in FIG. 4, the same reference numerals denote the same elements as in FIG. 1, and any further detailed descriptions of the same elements will be omitted hereinafter. Hereinafter, the ion beams injected from the ion gun 300 are denoted as reference numeral IB1 and the ion beams injected from the supplementary ion gun 390 are denoted as reference numeral IB2.

Referring to FIG. 4, the modified IBD apparatus 501 may further include the supplementary ion gun 390 over the substrate assembly 100. In the present example embodiment, the supplementary ion gun 390 may have substantially the same structure as the ion gun 300 shown in FIG. 1.

For example, the supplementary ion gun 390 may include a second discharge chamber 391 ionizing a supplementary source gas into supplementary source ions and a second ion grid IG2 connected to the second discharge chamber 391 and accelerating the supplementary source ions toward the substrate W. Thus, the supplementary source ions may be changed into the supplementary ion beams IB2 that may be directed toward the substrate W with high energy state. For example, the second ion grid IG2 may include a screen grid 392 defining the second discharge chamber 391, an acceleration grid 393, and a deceleration grid 394.

For example, the supplementary source gas may include inert gases, e.g., argon (Ar), krypton (Kr), neon (Ne), and xenon (Xe) just like the source gas. Thus, the kinetic energy of the supplementary ion beams IB2 may be optimized and the contamination caused by the impurities may be minimized in the IBD process.

The second discharge chamber 391, the second screen grid 392, the second acceleration grid 393, and the second deceleration grid 394 may have substantially the same structures as the first discharge chamber 310, the first screen grid 320, the first acceleration grid 330, and the first deceleration grid 340, respectively. Thus, any further detailed descriptions of the second discharge chamber 391, the second screen grid 392, the second acceleration grid 393, and the second deceleration grid 394 will omitted.

The high energy supplementary ion beams IB2 injected onto the substrate W may remove the contaminants from the substrate W, and may accelerate the deposition of the deposition particles DP onto the substrate W. When the supplementary ion beams IB2 reach the substrate W, the high kinetic energy of the supplementary ion beams IB2 may be converted into thermal energy, and the substrate W may undergo a surface treatment by the thermal energy.

The supplemental temperature increase due to the supplementary ion beams IB2 may reduce the operation load of the substrate heater 400. When the substrate W is sufficiently heated to the deposition temperature by the supplementary ion beams IB2, the substrate heater 400 may be replaced with the supplementary ion beams IB2. That is, no substrate heater 400 may be provided with the modified IBD apparatus 501. The thin layer L on the substrate W may have a proper grain size and a good crystallinity degree with minimized layer contamination.

For example, no neutralizer may be provided with the supplementary ion gun 390 because no voltage potential occurs between the supplementary ion gun 390 and the substrate W. In another example, when a voltage potential occurs between the supplementary ion gun 390 and the substrate W due to the voltage applied to the chuck 114, the neutralizer may also be provided with the supplementary ion gun 390 for preventing or minimizing the neutralization arc around the substrate W.

According to the supplementary ion gun 390, contaminants may be sufficiently removed from the substrate W, and the substrate W may be supplementary heated in the IBD process. Thus, the impurity and the crystallinity degree of the thin layer L may be improved, and the specific resistance of the thin layer L may be sufficiently reduced by the supplementary ion gun 390.

Figure 5:
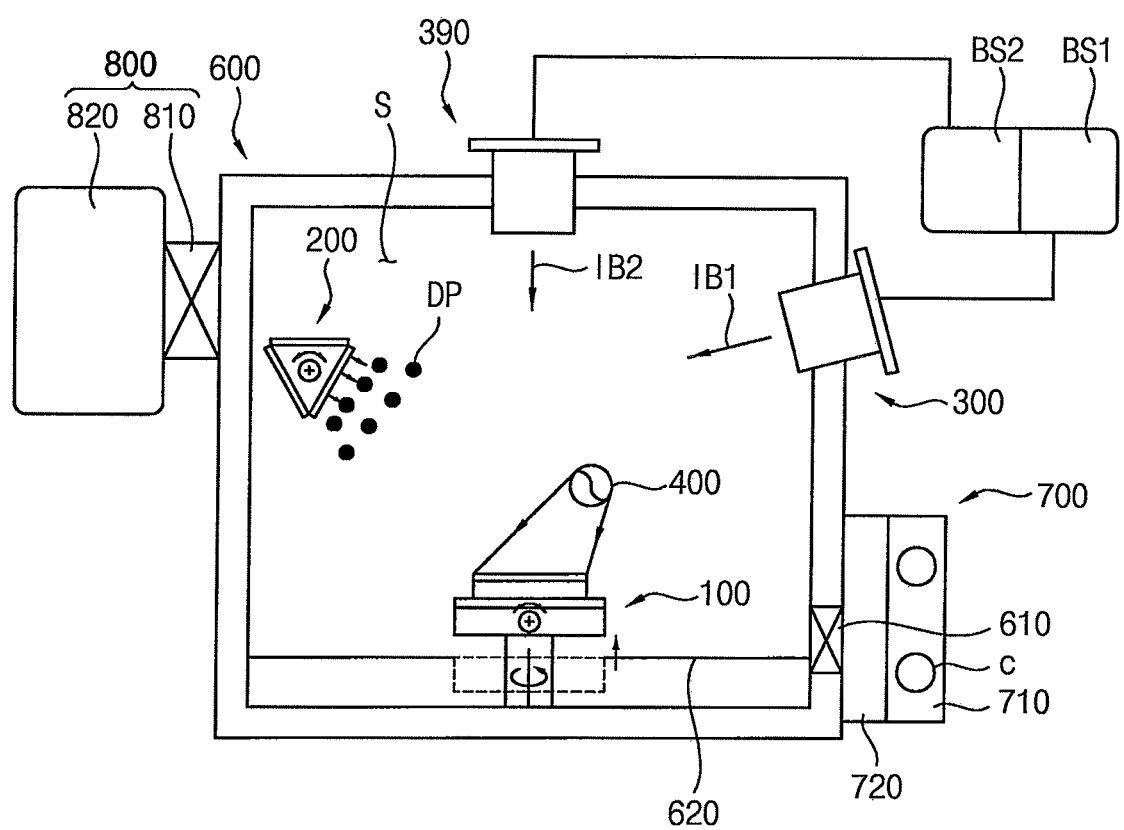
FIG. 5 illustrates a schematic view of an ion beam deposition apparatus in accordance with still another example embodiment.

FIG. 5 is a structural view illustrating an ion beam deposition apparatus in accordance with still another example embodiment. The IBD apparatus shown in FIG. 5 may include the IBD apparatus shown in FIG. 4. Thus, in FIG. 5, the same reference numerals denote the same elements as in FIG. 4, and any further detailed descriptions of the same elements will be omitted hereinafter. While the IBD apparatus shown in FIG. 5 includes the IBD apparatus shown in FIG. 4, the IBD apparatus shown in FIG. 5 may also include the IBD apparatus with heaters shown in FIGS. 1-3.

Referring to FIG. 5, another modified IBD apparatus 1000 in accordance with still another example embodiment may include a process chamber 600 in which an IBD process may be conducted, the substrate assembly 100 secured to a side of the process chamber 600, the target assembly 200 in the process chamber 600, the ion gun 300 secured to another side of the process chamber 600, the substrate heater 400 heating the substrate W, a substrate terminal 700 connected to the substrate assembly 100 and in which a plurality of the substrates W may be stacked, and a vacuum generator 800 connected to the process chamber 600 and applying a uniform vacuum pressure to the process chamber 600. The modified IBD apparatus 1000 may further include the supplementary ion gun 390 for injecting supplementary ion beams IB2 onto the substrate W.

For example, the process chamber 600 may include a 3-dimensional cubic structure having an inner space S in which the IBD process may be conducted. The process chamber 600 may include a single housing or a housing structure in which an upper housing and a lower housing may be combined to each other. Since the vacuum pressure may be applied to the process chamber 600, the process chamber may have sufficient strength and rigidity for the vacuum pressure. A gate 610 may be provided with the process chamber 600 through which the substrate W may be loaded to the process chamber 600 from the substrate terminal 700 or may be unloaded to the substrate terminal 700 from the process chamber 600.

The substrate terminal 700 may be connected to the process chamber 600 via the gate 610. For example, the substrate terminal 700 may include a substrate carrier C in which a plurality of substrates W may be stacked, a load port 710 on which the substrate carrier C may be combined, and a substrate delivery unit 720 transferring the substrate W between the substrate carrier C and the process chamber 600. The substrate carrier C may move in a semiconductor manufacturing factory for exchanging substrates W between various unit process apparatuses for a semiconductor manufacturing process. The substrate delivery unit 720 may include, e.g., a robot arm, and the substrate carrier C may include a wafer cassette and a Front Opening Unified Pod (FOUP). When the substrate W is needed for the IBD process, the substrate W may be loaded into the process chamber 600 from the substrate carrier C, and when the thin layer L is sufficiently formed on the substrate W in the IBD, the substrate W may be unloaded into the substrate carrier C from the process chamber 600.

A substrate guide 620 may be provided between the substrate assembly 100 and the substrate delivery unit 720 through the gate 610. The substrate W may be firstly extracted from the substrate carrier C and may be mounted on the substrate guide 620 by the substrate delivery unit 720. Then, the substrate guide 620, on which the substrate W may move to the substrate assembly 100, may load the substrate W onto the substrate holder 110.

The vacuum generator 800 may be positioned at a side of the process chamber 600, and may be connected to the process chamber 600. A uniform vacuum pressure may be applied to the process chamber 600 by the vacuum generator 800. For example, the vacuum generator 800 may include a gate valve 810 connected to the process chamber 600 and a vacuum pump 820 applying the vacuum pressure to the inside of the process chamber 600 via the gate valve 810.

In the present example embodiment, the inner space S of the process chamber 600 may be under a uniform vacuum pressure in a range of, e.g., about $10^{-5}$ Torr to about $10^{-9}$ Torr in the IBD process. Thus, the deposition particles DP may reach the substrate W without any substantial losses of the kinetic energy in the process chamber 600.

The substrate assembly 100 may be positioned at another side of the process chamber 600 adjacent to the gate 610. The support 120 of the substrate assembly 100 may extend from the side portion of the process chamber 600 in the inner space S and may move upward and downward between a load/unload portion and a deposition position.

An upper surface of the chuck 114 and an upper surface of the substrate guide 620 may be coplanar with each other at the load/unload position. Thus, the substrate W may be loaded onto the chuck 114 from the substrate guide 620 or may be unloaded onto the substrate guide 620 from the chuck 114 at the load/unload position. When the substrate W is loaded onto the chuck 114, the substrate W may be secured to the chuck 114 by an electrostatic force and the support 120 may move upward to the deposition position.

Then, the body 112 of the substrate holder 110 may be tilted with respect to the tilting axis TA1 in such a way that the target face "a" and the substrate W may constitute the deposition geometry for the IBD process. While the present example embodiment discloses that the substrate W is arranged to be horizontal, i.e., substantially perpendicular with respect to the support 120, to have a slant angle of about 0°, the slant angle may be varied according to the positions of the substrate assembly 100 and the ion gun 300.

The target assembly 200, to which a plurality of targets 220 may be secured, may be positioned at a side portion of an upper portion of the process chamber 600. The ion gun 300 may be positioned at another side portion of the upper portion of the process chamber 600 in such a configuration that the ion gun may be slanted with respect to the target 220.

A source gas may be supplied into the first discharge chamber 310 from a first beam source BA1 that may be positioned at an exterior of the process chamber 600, and the source gas may be changed into the source ions. The source ions may be accelerated until the source ions reach a high energy state and may accelerate straight toward the target 220 by the first ion grid IG1. Thus, the source ions may be changed into the ion beams IB1 through the first ion grid IG1.

When the ion beams IB1 are injected onto the target 220 from the ion gun 300, the ion beams IB may collide with the deposition materials of the target 220 and the ions of the deposition materials may be discharged from the target 220 as the deposition particles DP. Since the target 220, the substrate W, and the ion gun 300 are arranged into the deposition geometry structure, the deposition particles DP discharged from the target face "a" may move toward the substrate W. Thus, the deposition particles DP may be deposited into the thin layer L on the substrate W.

The substrate heater 400 may be positioned over the substrate W in the process chamber 600. The substrate W may be maintained at the deposition temperature in the IBD process by the substrate heater 400. The deposition temperature of the substrate W may be in a range of about 150° C. to about 300° C.

The deposition material of the target 220 may be varied according to the composition of the thin layer L on the substrate W. In the present example embodiment, the target 220 may include a low resistive metal, and thus a low resistive metal layer may be formed on the substrate W by IBD process. Examples of the low resistive metal may include tungsten (W), ruthenium (Ru), tantalum (Ta), titanium (Ti), aluminum (Al), copper (Cu), molybdenum (Mo), cobalt (Co), osmium (Os), platinum (Pt), nickel (Ni), chromium (Cr), silver (Ag), germanium (Ge), magnesium (Mg), palladium (Pd), hafnium (Hf), zinc (Zn), vanadium (V) and zirconium (Zr). Those materials may be used alone or in combinations thereof. In addition, any alloys of the above metals and any nitrides of the above metals may also be used as the low resistive metal. As a result, the deposition particle DP may also include a metal atom or a metal ion.

Particularly, since the substrate W may be heated to the deposition temperature, which is a relatively high temperature compared with a room temperature, the resultant thin layer L may have a relatively large grain size and an excellent crystallinity degree, e.g. compared with thin layers formed by an IBD process at a room temperature. Accordingly, the specific resistance of the resultant thin layer L may be sufficiently reduced compared with that of a thin layer formed by an IBD process at a room temperature. In the present example embodiment, the thin layer L on the substrate W may have a grain size of about 80 nm to about 10 nm, and a specific resistance of about 5 Ωm to about 9 Ωm, so the thin layer L may be sufficiently formed into a low resistive metal wirings for the semiconductor devices.

The supplementary ion gun 390 may be positioned at a ceiling of the process chamber 600, so the supplementary ion beams IB2 may be injected onto a whole surface of the substrate W. A supplementary source gas may be supplied into the second discharge chamber 391 from a second beam source BA2 that may be positioned at an exterior of the process chamber 600, and the supplementary source gas may be changed into the supplementary source ions. The supplementary source ions may be accelerated until the supplementary source ions reach a high energy state and may accelerate straight toward the substrate W by the second ion grid IG2. Thus, the supplementary source ions may be changed into the supplementary ion beams IB2 through the second ion grid IG2.

When the supplementary ion beams IB2 are injected onto the substrate W from the supplementary ion gun 390, the substrate W may be heated by the supplementary ion beams IB2, and the contaminants on the substrate W may be removed due to the increase of the substrate temperature. Therefore, the impurities on the thin layer L may be decreased, and the crystallinity degree of the thin layer L may be increased.

The target assembly 200, the ion gun 300, the substrate heater 400, and the supplementary ion gun 390 may have substantially the same structures as those shown in FIG. 4, and thus any further detailed descriptions thereof will be omitted.

According to the example embodiment, the substrate W may be heated to the deposition temperature higher than a room temperature in the IBD process by the substrate heater and/or the supplementary ion gun 390. Thus, the thin layer L may be formed on the substrate W with a sufficiently large grain size and a sufficiently good crystallinity degree in the present IBD apparatus 1000. Accordingly, the specific resistance of the resultant thin layer may be sufficiently reduced and the thin layer L may be formed into low resistive metal wirings for the semiconductor devices.

Figure 6:
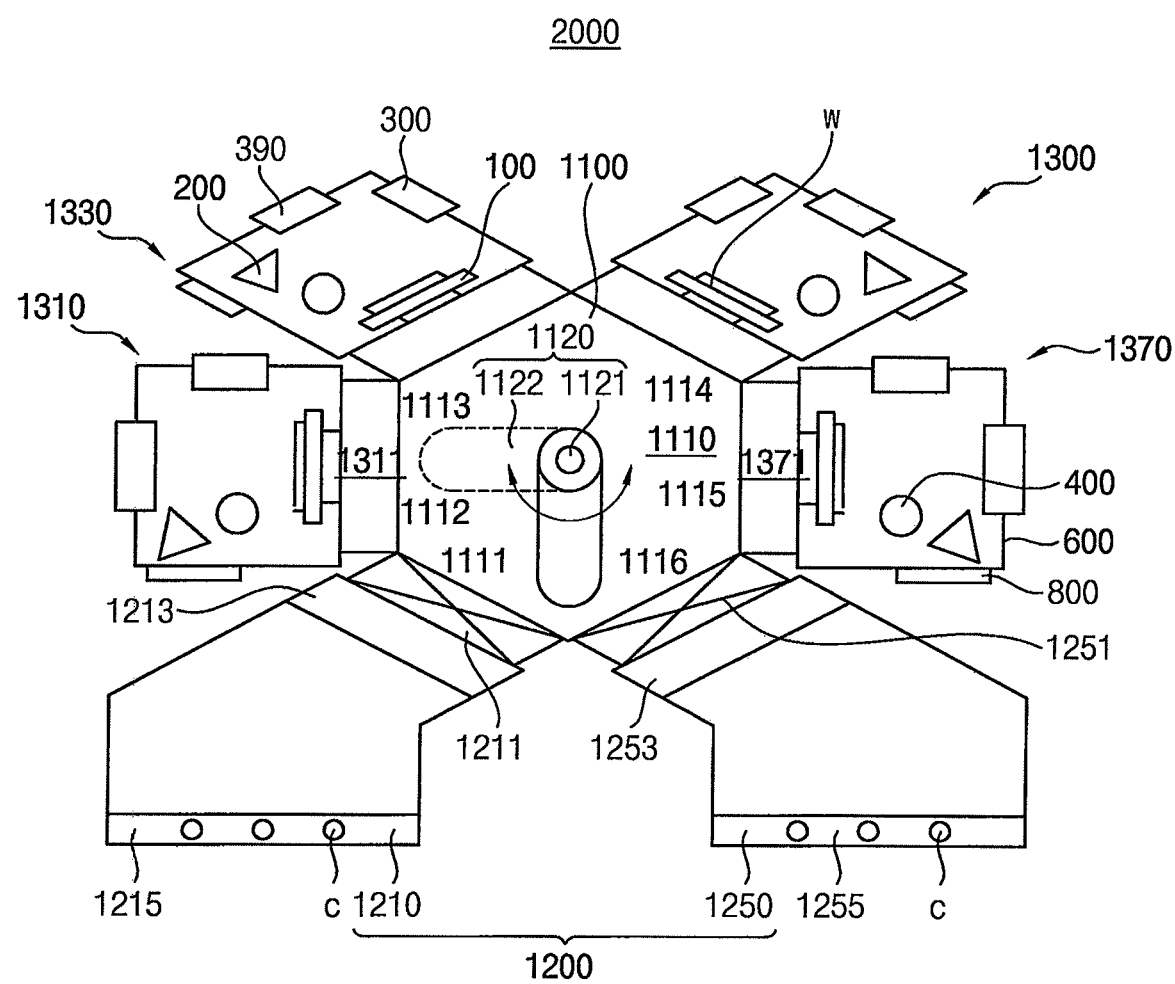
FIG. 6 illustrates a structural view of an ion beam deposition system including the ion beam deposition apparatus shown in FIG. 5.

FIG. 6 is a structural view illustrating an ion beam deposition system including the ion beam deposition apparatus shown in FIG. 5.

Referring to FIG. 6, an ion beam deposition system 2000 in accordance with an example embodiment may include a substrate transfer apparatus 1100 including a substrate handler 1120 transferring a substrate, a substrate terminal apparatus 1200 positioned at a side of the substrate transfer apparatus 1100 and including at least a substrate carrier, in which a plurality of substrates W may be stacked, and at least an ion beam deposition apparatus 1300 positioned at another side of the substrate transfer apparatus 1100 and conducting an ion beam deposition process on the substrate W loaded from the substrate carrier by the substrate handler 1120, to thereby form a thin layer on the substrate W.

For example, the substrate transfer apparatus 1100 may include a transfer chamber 1110 shaped into a polygonal cylinder and the substrate handler 1120 positioned at a center of the transfer chamber 1110 and rotating with respect to a central axis thereof.

In the present example embodiment, the transfer chamber 1110 may be shaped into a hexagonal cylinder having first to sixth faces 1111 to 1116. Thus, four IBD apparatuses and two substrate terminals 1210 and 1250 may be positioned at each face of transfer chamber 1110. Thus, four IBD processes may be simultaneously conducted in the IBD system 2000.

The substrate handler 1120 may include a fixed rod 1121 secured to the center position of the transfer chamber 1110 and a transfer arm 1122 rotatably combined to the fixed rod 1121. Thus, the transfer arm 1122 may be rotated with respect to the fixed rod 1121. The transfer arm 1122 may transfer the substrate W between the substrate terminal apparatus 1200 and the IBD apparatus 1300 according to operation algorithms of the IBD system 2000.

The substrate terminal apparatus 1200 may include a first substrate terminal 1210 connected to the first face 1111 of the transfer chamber 1110 and a second substrate terminal 1220 connected to the sixth face 1116 of the transfer chamber 1110. A plurality of the substrates W, which may be on standby for the IBD process, may be stored in the first substrate terminal 1210, and a plurality of the substrates W, on which the IBD process may be completed, may be stored in the second substrate terminal 1250.

The first substrate terminal 1210 may be selectively communicated with the transfer chamber 1110 through an inlet gate 1211, and the second substrate terminal 1250 may be selectively communicated with the transfer chamber 1110 through an outlet gate 1251.

A plurality of the substrate carriers C may be located on a first load port 1215 and a second load port 1255, respectively. The substrate carrier C on the first load port 1215 may face a first substrate delivery unit 1213, and the substrate W may be extracted from the substrate carrier C by first substrate delivery unit 1213, and the extracted substrate W may be delivered to the substrate handler 1120 by the first substrate delivery unit 1213. Then, the substrate W may be loaded into one of the IBD apparatuses 1310 to 1340 by the substrate handler 1120. When the IBD process is completed in any one of the IBD apparatuses 1310 to 1340, the substrate W may be unloaded from one of the IBD apparatuses and may be transferred to the second substrate delivery unit 1253 by the substrate handler 1120. Then, the substrate W may be stacked in the substrate carrier C on the second load port 1255 of the second substrate terminal 1250 by the second substrate delivery unit 1253. The substrate carrier C may be located on the second load port 1255 in such a configuration that the substrate carrier C may face the second substrate delivery unit 1253.

The first and the second substrate delivery units 1213 and 1253 may have substantially the same structures as the substrate delivery unit 720 of the IBD apparatus and the first and the second load ports 1215 and 1255 may have substantially the same structures as the load port 710 of the IBD apparatus 1000 shown in FIG. 4.

The first to fourth IBD apparatuses 1310 to 1340 may be positioned at side portions of the second face to fifth face 1112 to 1115, respectively. First to fourth load lock chambers 1311, 1231, 1351 and 1371 may be located between the transfer chamber 1110 and the first to fourth IBD apparatuses 1310 to 1340, respectively. Since a vacuum pressure may be applied to each process chamber 600 of the first to fourth IBD apparatuses 1310 to 1340, and an atmospheric pressure may be applied to the transfer chamber 1110, a middle pressure may be applied to the load lock chambers 1311, 1231, 1351 and 1371 between the vacuum pressure and an atmospheric pressure, thereby minimizing the pressure variation shock between each process chamber 600 of the first to fourth IBD apparatuses 1310 to 1340 and the transfer chamber 1110.

The first to fourth IBD apparatuses 1310, 1330, 1350 and 1370 may have substantially the same structures as the IBD apparatus shown in FIG. 4. Thus, each of the IBD apparatuses 1310, 1330, 1350 and 1370 may include a process chamber 600 in which the ion beam deposition process may be conducted, a substrate assembly 100 secured to a side of the process chamber 600 and onto which the substrate may be secured, a target assembly 200 slanted with respect to the substrate assembly 100 in the process chamber 600 and to which a target 220 including deposition materials may be secured, an ion gun 300 secured to another side of the process chamber 600 and injecting ion beams IB1 onto the target 220 such that ions of the deposition materials may be discharged from the target 220 as deposition particles DP and may be deposited into the thin layer L on the substrate W, a substrate heater 400 heating the substrate W to a deposition temperature higher than a room temperature, and a vacuum generator 800 connected to the process chamber 600 and applying a uniform vacuum pressure to the process chamber 600.

The substrate assembly 100, the target assembly 200, the ion gun 300, the substrate heater 400, the process chamber 600 and the vacuum generator 800 may have substantially the same structures as those of the IBD apparatus 1000 described in detail with reference to FIG. 4.

According to the IBD system 2000, a plurality of the IBD processes may be simultaneously conducted at a time, so the process efficiency of the IBD process may be remarkably improved. The IBD system may be operated under a computer control system having deposition algorithms in such a way that four IBD apparatuses and two substrate terminals may be systematically controlled. Thus, a multiple IBD process may be conducted in the IBD system 2000. While the present example embodiment discloses that the transfer chamber 1110 may be configured into a single-floor hexagonal cylinder, the transfer chamber 1110 may be shaped into any other polygonal structures, and further may be configured into a multi-floor structure.

Figure 7:
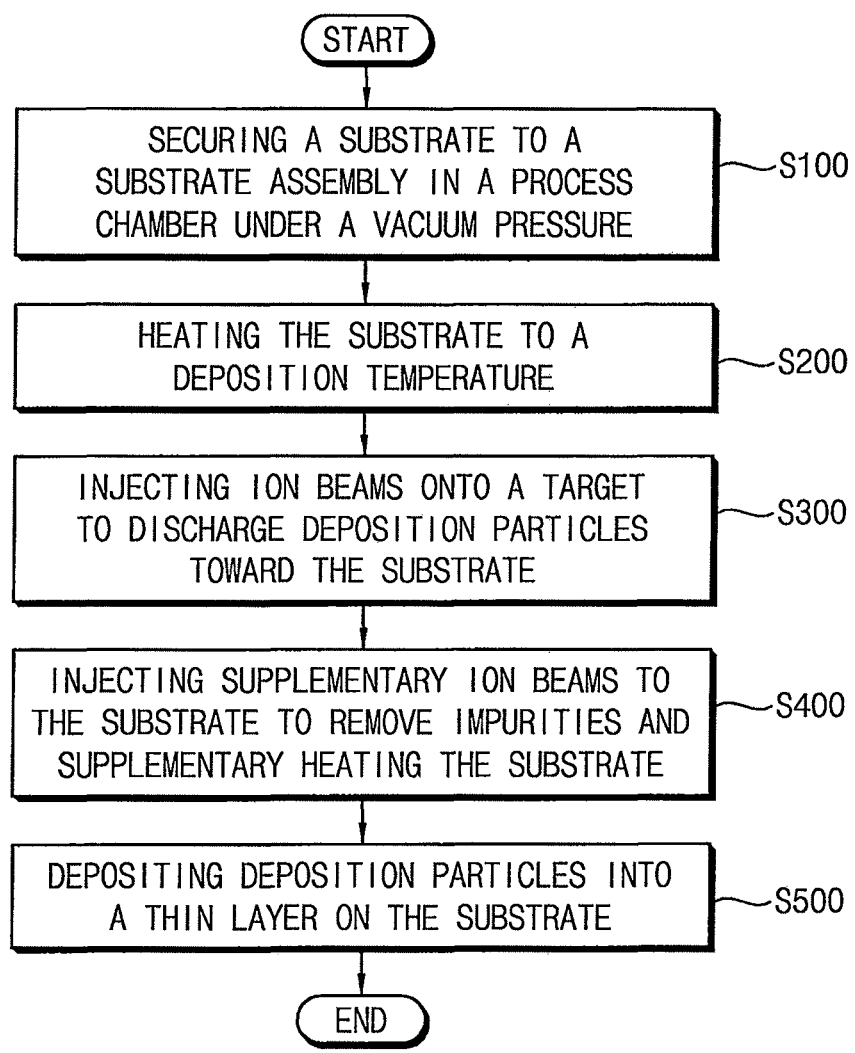
FIG. 7 illustrates a flow chart of stages in a method of forming a thin layer on a substrate in the ion beam deposition system shown in FIG. 5.

FIG. 7 is a flow chart showing process steps for a method of forming a thin layer on a substrate in the ion beam deposition system shown in FIG. 5.

Referring to FIGS. 5 and 7, the substrate W may be secured onto the substrate assembly 100 in the process chamber 600 (operation S100).

The vacuum generator 800 may be operated and the inner space S of the process chamber 600 may be under a vacuum pressure in a range of about $10^{-5}$ Torr to about $10^{-9}$ Torr.

Then, the substrate W extracted from the substrate carrier C may be loaded onto the chuck 114 by the substrate guide 620 and the substrate W may be secured to the chuck 114 by the electrostatic force. Alternatively, the substrate W may be firstly secured to the chuck 114, and then the vacuum pressure may be applied to the process chamber 600.

Then, the substrate W may be heated to the deposition temperature (operation S200). For example, the lamp structure 410, the line electric heater 420, or the surface electric heater 430 may be operated outside of the substrate assembly 100, and thus the radiation heat may be transferred to an overall surface of the substrate W. In the present example embodiment, the deposition temperature of the substrate W may be in a range of about 150° C. to about 300° C.

Thereafter, the ion beams IB1 may be injected onto the target 220 in such a way that the deposition particles DP may be discharged from the target 220 and may move toward the substrate W (operation S300). Further, the supplementary ion beams IB2 may be injected onto the substrate W simultaneously with the deposition particles DP. Thus, the substrate W may be supplementary heated by the supplementary ion beams IB2 and the contaminants may be removed from the substrate W by the supplementary heat due to the supplementary ion beams IB2 (operation S400).

The source gases supplied into the first discharge chamber 310 may be changed into source ions and then the source ions may be changed into the high energy ion beams IB1 directed toward the target assembly 200 by the first ion grid IG1. When the high energy ion beams IB1 are injected onto the target 220 from the ion gun 300, the ion beams IB may collide with the deposition materials of the target 220 and the ions of the deposition materials may be discharged from the target 220 as the deposition particles DP. In such a case, the neutralizer 350 may be selectively positioned at an end portion of the first ion grid IG1 and be shaped into a cylinder enclosing an injection hole through which the ion beams IB may be injected onto the target 220. The neutralizer 350 may supply electrons into a gap space between the target 220 and the ion gun 300. The electrons in the gap space may decrease the voltage potential between the ion beams IB and the target 220 to thereby prevent or minimize the neutralization arc around the target 220.

Particularly, the ion gun 300 and the target 220 may be slated with each other in such a way that the deposition particles DP may move toward the substrate W. For example, the substrate W, the target 220 and the ion gun 300 may constitute deposition geometry in the IBD process in which the ion beams IB1 are injected onto the target 220 with maximal energy and the deposition particles DP may be discharged in a direction toward the substrate W. The supplementary ion beams IB2 may also be injected onto the substrate W together with the ion beams IB1.

The supplementary source gases supplied into the second discharge chamber 391 may be changed into supplementary source ions and then the supplementary source ions may be changed into the high energy supplementary ion beams IB2 directed toward the substrate W by the second ion grid IG2. When the supplementary ion beams IB2 are injected onto the substrate W from the supplementary ion gun 390, the substrate W may be supplementary heated by the supplementary ion beams IB2 and the contaminants on the substrate W may be removed due to the increase of the substrate temperature.

Then, the deposition particles DP may reach the substrate W and may be deposited into the thin layer L on the substrate W (step S500).

The target 220 and the substrate W may be positioned within a mean free path of the deposition particles DP. Thus, the deposition particles DP may reach the substrate W without any collisions with each other and may be deposited into the thin layer L without any energy losses.

When the target 220 and the substrate W are spaced apart from each other higher than the mean free path of the deposition particles DP, an addition bias may be applied to the chuck 114 for guiding the deposition particles DP toward the substrate W. In such a case, a neutralizer may be further positioned at an end portion of the second ion grid IG2 for preventing or minimizing the neutralization arc around the substrate W.

According to the above IBD process, the present thin layer L may be formed into a metal layer having a grain size of about 80 nm to about 100 nm and a specific resistance of about 5 Ωm to about 9 Ωm. Therefore, the low resistive metal wirings for the recent semiconductor devices may be steadily formed in the IBD apparatus 1000.

By way of summation and review, when forming metal wires according to the CVD process, source chemicals may be changed into a plasma state at a high temperature, and the CVD metal wiring may be formed on a substrate by plasma absorption. Thus, the resistance of the CVD metal wiring necessarily increases due to the impurities in the plasma absorption. Further, when forming metal wires according to the PVD process, the PVD metal wiring may be formed by sputtering of reactive ions toward the substrate. Thus, the PVD metal wiring is necessarily oxidized due to the reactive ions, and the degree of crystallinity in the PVD metal wiring is intrinsically relatively poor. Therefore, there may be limits to reducing the resistance of the CVD metal wirings or the PVD metal wirings.

While attempts have been made to form metal wirings by an ion beam deposition (IBD) process (which may sufficiently prevent oxidation of the metal wiring and the low crystallinity and may be conducted at a room temperature substantially without impurities), a thin layer formed by the IBD process may exhibit a relatively high specific resistance. Accordingly, the IBD process has not been used for forming low resistive metal wiring for semiconductor devices.

In contrast, example embodiments provide an ion beam deposition apparatus in which a substrate is heated during an ion beam deposition process, thereby forming a low resistive thin layer having sufficient crystallinity and grain size. Other example embodiments provide a deposition system having the above ion beam deposition apparatus.

That is, according to example embodiments, the substrate may be heated to a temperature over the room temperature in the IBD process, so the thin layer may have a sufficiently large grain size. In addition, the crystallinity degree of the thin layer may sufficiently increase, and as a result, the specific resistance of the thin layer may be sufficiently reduced. Thus, the low resistive metal wirings for the semiconductor devices may be easily and steadily formed in the present IBD apparatus. Further, a plurality of IBD apparatuses may be installed around a single transfer chamber, so a plurality of the IBD processes may be simultaneously conducted with high deposition efficiency.

According to the example embodiments, the substrate may be heated at a temperature over the room temperature in the IBD process, so the thin layer may have a sufficient large grain size. In addition, the crystallinity degree of the thin layer may sufficiently increase and as a result, the specific resistance of the thin layer may be sufficiently reduced. Thus, the low resistive metal wirings for the semiconductor devices may be easily and steadily may be formed in the present IBD apparatus. Further, a plurality of IBD apparatuses may be installed around a single transfer chamber and a plurality of the IBD processes may be simultaneously conducted with high deposition efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An ion beam deposition apparatus, comprising:
a substrate assembly to secure a substrate;
a target assembly slanted with respect to the substrate assembly, the target assembly including a target with deposition materials;
an ion gun to inject ion beams onto the target, such that ions of the deposition materials are discharged toward the substrate assembly to form a thin layer on the substrate;
a supplementary ion gun to inject supplementary ion beams onto the substrate assembly; and
a substrate heater to heat the substrate to a deposition temperature higher than a room temperature, the substrate heater including a lamp between the substrate assembly and the supplementary ion gun, and the lamp being outside the substrate assembly and emitting heat toward the substrate assembly.

2. The ion beam deposition apparatus as claimed in claim 1, wherein the lamp includes a thermal carbon radiator, a xenon lamp, or a halogen lamp.

3. The ion beam deposition apparatus as claimed in claim 1, wherein the substrate assembly includes:
a substrate holder to hold the substrate, the substrate being tiltable at a predetermined angle; and
a support connected to and supporting the substrate holder, the support being rotatable with respect to a central axis through a center of the substrate holder.

4. The ion beam deposition apparatus as claimed in claim 1, wherein the target includes at least one of tungsten (W), ruthenium (Ru), tantalum (Ta), titanium (Ti), aluminum (Al), copper (Cu), molybdenum (Mo), cobalt (Co), osmium (Os), platinum (Pt), nickel (Ni), chromium (Cr), silver (Ag), germanium (Ge), magnesium (Mg), palladium (Pd), hafnium (Hf), zinc (Zn), vanadium (V), zirconium (Zr), an alloy thereof and a metal nitride thereof.

5. An ion beam deposition apparatus, comprising:
a process chamber to accommodate an ion beam deposition process;
a substrate assembly inside the process chamber, the substrate assembly to secure a substrate;
a target assembly slanted with respect to the substrate assembly, the target assembly including a target with deposition materials;
an ion gun inside the process chamber, the ion gun to inject ion beams onto the target, such that ions of the deposition materials are discharged toward the substrate assembly to form a thin layer on the substrate;
a supplementary ion gun inside the process chamber to inject supplementary ion beams onto the substrate assembly;
a substrate heater inside the process chamber, the substrate heater being at a height level between a bottom of the substrate assembly and the supplementary ion gun, and the substrate heater to heat the substrate to a deposition temperature higher than a room temperature;

a substrate terminal connected to the process chamber, the substrate terminal to accommodate a plurality of substrates; and a vacuum generator connected to the process chamber, the vacuum generator to apply a uniform predetermined vacuum pressure to the process chamber.

6. The ion beam deposition apparatus as claimed in claim 5, wherein the substrate assembly includes:

a support connected to a first interior sidewall of the process chamber, the support being rotatable; and a substrate holder on the support to hold the substrate, the substrate being tiltable at a predetermined angle.

7. The ion beam deposition apparatus as claimed in claim 6, wherein the substrate heater includes an electric heater inside the substrate holder, the electric heater being shaped into a spiral line.

8. The ion beam deposition apparatus as claimed in claim 5, wherein the substrate heater includes a lamp arranged in the process chamber, the lamp being between a top of the substrate assembly and the supplementary ion gun, and the lamp emitting heat toward the substrate assembly.

9. The ion beam deposition apparatus as claimed in claim 5, wherein the predetermined vacuum pressure in the process chamber is in a range of $10^{-5}$ Torr to $10^{-9}$ Torr.

10. The ion beam deposition apparatus as claimed in claim 5, wherein a temperature of the substrate is in a range of 150° C. to 300° C. in the ion beam deposition process.

11. The ion beam deposition apparatus as claimed in claim 5, wherein the ion gun includes:

a first discharge chamber to ionize a source gas into source ions;

a first ion grid connected to the first discharge chamber, the first ion grid to accelerate the source ions toward the target assembly, and to change the source ions into ion beams directed toward the target assembly with high energy state; and a neutralizer to emit electrons toward the ion beams and to prevent a neutralization arc around the target assembly.

12. The ion beam deposition apparatus as claimed in claim 11, wherein the supplementary ion gun includes:

a second discharge chamber to ionize a supplementary source gas into supplementary source ions; and a second ion grid connected to the second discharge chamber, the second ion grid to accelerate the supplementary source ions toward the substrate assembly, and to change the supplementary source ions into the supplementary ion beams at a high energy state directed toward the substrate assembly.

13. The ion beam deposition apparatus as claimed in claim 12, wherein the source gas and the supplementary source gas include at least one of argon (Ar), krypton (Kr), neon (Ne) and xenon (Xe).

14. The ion beam deposition apparatus as claimed in claim 5, wherein the vacuum generator includes a vacuum pump.

15. The ion beam deposition apparatus as claimed in claim 5, wherein the substrate terminal includes:

a substrate carrier to accommodate the plurality of substrates;

a load port attached to the substrate carrier; and a substrate delivery unit to deliver the substrates between the substrate carrier and the process chamber.

16. A deposition system, comprising:

a substrate transfer apparatus including a substrate handler to transfer a substrate;

a substrate terminal at a first side of the substrate transfer apparatus, the substrate terminal including at least a substrate carrier to accommodate a plurality of substrates; and at least one ion beam deposition apparatus at a second side of the substrate transfer apparatus, the at least one ion beam deposition apparatus to conduct an ion beam deposition process on the substrate to form a thin layer thereon, wherein the at least one ion beam deposition apparatus includes:

a process chamber to accommodate the ion beam deposition process, a substrate assembly secured to a side of the process chamber and onto which the substrate is secured, a target assembly slanted with respect to the substrate assembly in the process chamber, the target assembly including a target with deposition materials, an ion gun inside the process chamber, the ion gun to inject ion beams onto the target, such that ions of the deposition materials are discharged toward the substrate assembly to form the thin layer on the substrate, a supplementary ion gun in the chamber to inject supplementary ion beams toward the substrate assembly, a substrate heater inside the process chamber, the substrate heater being at a height level between a bottom of the substrate assembly and the supplementary ion gun, and the substrate heater to heat the substrate to a deposition temperature higher than a room temperature, and a vacuum generator connected to the process chamber, the vacuum generator to apply a uniform predetermined vacuum pressure to the process chamber.

* * * * *